United States Patent
Toubou et al.

(10) Patent No.: US 8,261,225 B2
(45) Date of Patent: *Sep. 4, 2012

(54) SEMICONDUCTOR INTEGRATED CIRCUIT, STANDARD CELL, STANDARD CELL LIBRARY, SEMICONDUCTOR INTEGRATED CIRCUIT DESIGNING METHOD, AND SEMICONDUCTOR INTEGRATED CIRCUIT DESIGNING EQUIPMENT

(75) Inventors: Tetsurou Toubou, Hyogo (JP); Nana Okamoto, Osaka (JP); Junichi Yano, Osaka (JP)

(73) Assignee: Panasonic Corporation, Osaka (JP)

(*) Notice: Subject to any disclaimer, the term of this patent is extended or adjusted under 35 U.S.C. 154(b) by 353 days.

This patent is subject to a terminal disclaimer.

(21) Appl. No.: 12/714,819

(22) Filed: Mar. 1, 2010

(65) Prior Publication Data

US 2010/0148235 A1  Jun. 17, 2010

Related U.S. Application Data

(62) Division of application No. 11/476,124, filed on Jun. 28, 2006, now Pat. No. 7,685,551.

(30) Foreign Application Priority Data

Jun. 30, 2005 (JP) .................................. 2005-191433

(51) Int. Cl.
*G06F 17/50* (2006.01)

(52) U.S. Cl. ........ 716/122; 716/118; 716/119; 716/132; 716/139

(58) Field of Classification Search .................. 716/118, 716/119, 122, 132, 139
See application file for complete search history.

(56) References Cited

U.S. PATENT DOCUMENTS

| 5,350,704 | A | * | 9/1994 | Anderson et al. ............. 438/129 |
| 5,847,421 | A | | 12/1998 | Yamaguchi |
| 6,084,256 | A | | 7/2000 | Nakata |
| 6,194,252 | B1 | | 2/2001 | Yamaguchi |
| 6,635,935 | B2 | | 10/2003 | Makino |

(Continued)

FOREIGN PATENT DOCUMENTS

JP  9-289251  11/1997

(Continued)

OTHER PUBLICATIONS

Japanese Notice of Reasons for Rejections, w/ English translation thereof, issued in Japanese Patent Application No. JP 2005-191433 dated Feb. 22, 2011.

(Continued)

*Primary Examiner* — Sun Lin
(74) *Attorney, Agent, or Firm* — McDermott Will & Emery LLP

(57) ABSTRACT

A semiconductor integrated circuit includes a first transistor which is formed of a first gate extending in a first direction and a first diffusion region and which is capable of being active, a second transistor which is formed of a second gate extending in the first direction and a second diffusion region and which is arranged adjacent to the first transistor in a second direction intersected at a right angle with the first direction, and a third gate which extends in the first direction and which is arranged adjacent in the second direction to the first transistor on an opposite side to the second transistor. A space between the first gate and the second gate is larger than a space between the first gate and the third gate.

62 Claims, 11 Drawing Sheets

U.S. PATENT DOCUMENTS

| | | |
|---|---|---|
| 6,787,823 B2 | 9/2004 | Shibutani |
| 6,875,680 B1 | 4/2005 | Park |
| 6,963,115 B2 | 11/2005 | Nakata et al. |
| 7,290,234 B2 | 10/2007 | Shibayama |
| 7,302,660 B2 * | 11/2007 | Shimamura .................. 257/206 |
| 2004/0175909 A1 | 9/2004 | Matsumoto |
| 2005/0009312 A1 | 1/2005 | Butt et al. |
| 2005/0048729 A1 | 3/2005 | Yoon et al. |
| 2005/0116268 A1 | 6/2005 | Tahira et al. |
| 2005/0280031 A1 | 12/2005 | Yano |

FOREIGN PATENT DOCUMENTS

| | | |
|---|---|---|
| JP | 10-32253 | 2/1998 |
| JP | 10-41398 | 2/1998 |
| JP | 2002-26125 A | 1/2002 |
| JP | 2002-368080 | 12/2002 |
| JP | 2004-55823 A | 2/2004 |
| JP | 2004-172461 | 6/2004 |
| JP | 2004-289138 | 10/2004 |
| JP | 2005-20008 | 1/2005 |

OTHER PUBLICATIONS

Chinese Office Action issued in Chinese Patent Application No. CN 2006101005027, mailed on Mar. 7, 2008.

Chinese Office Action issued in Chinese Patent Application No. CN 2006101005027, dated on Aug. 15, 2008.

* cited by examiner

SEMICONDUCTOR INTEGRATED CIRCUIT, STANDARD CELL, STANDARD CELL LIBRARY, SEMICONDUCTOR INTEGRATED CIRCUIT DESIGNING METHOD, AND SEMICONDUCTOR INTEGRATED CIRCUIT DESIGNING EQUIPMENT

CROSS REFERENCE TO RELATED APPLICATIONS

This application is a Divisional of application Ser. No. 11/476,124, filed on Jun. 28, 2006, now U.S. Pat. No. 7,685,551, which in turn claims priority under 35 U.S.C. §119(a) to Japanese Application No. 2005-191433, filed Jun. 30, 2005 in Japan, the entire contents of each of which are hereby incorporated by reference.

BACKGROUND OF THE INVENTION

The present invention relates to a semiconductor integrated circuit and a designing technique thereof and particularly relates to an effective technique for suppressing optical proximity effect.

In a semiconductor integrated circuit, main factors of dispersion of propagation delay time of signals are dispersion of power supply voltage in operation, dispersion of temperature, dispersion in the manufacturing process, and the like. The semiconductor integrated circuits must be designed so that the operation thereof is guaranteed even when all the above factors of dispersion become the worst. Particularly, gate length of a transistor plays a significant role for defining the operation of the transistor, and dispersion of gate length occupies large in the factors of dispersion in the process. Further, in recent years, the gate length becomes smaller and smaller in association with development of transistor miniaturization to display a tendency for increasing a ratio of influence of dispersion of gate length to the dispersion in the manufacturing process. For this reason, the dispersion of propagation delay time increases, which in turn requires a large design margin to make it difficult to provide a high performance semiconductor integrated circuit.

Furthermore, in the process of manufacturing a semiconductor integrated circuit, in general, a photolithography step including resist application, exposure, and development, an etching step for element patterning using a resist mask, and a resist removing step are repeated to form a integrated circuit on a semiconductor substrate. In forming a gate of a transistor, the photolithography step, the etching step, and the resist removing step are performed. In exposure in the photolithography step, when the pattern dimension is smaller than the wavelength of exposure light, optical proximity effect by an influence of diffracted light makes error between a layout dimension at design and an actual pattern dimension in the semiconductor substrate large.

Under the circumstances, it is essential to perform correction for suppressing dimensional error of the pattern which is caused by the optical proximity effect at rendering or exposing of a pattern such as a wiring pattern in the semiconductor integrated circuit. OPC (Optical Proximity effect Correction) is known as a technique for correcting the optical proximity effect. OPC is a technique in which an amount of variation in gate length caused by the optical proximity effect is predicted from the distance between a gate and another adjacent gate pattern and a mask value of a photoresist mask for forming the gate is corrected so as to cancel the amount of variation to bring the finished value of the gate length after exposure consistent.

In conventional layout techniques, since gate patterns are not standardized, and the gate length and the gate intervals are different part from part in an entire chip, correction by OPC is necessary. However, the gate mask correction through OPC invites delay in TAT (Turn Around Time) and an increase in processing amount.

In order to avoid the foregoing, a technique is proposed in which the gate length and the gate intervals are equalized to respective single values for layout. In this proposal, by circuit design with the gate length of a single value or by inserting a dummy gate playing no role as an actual element for equalizing the gate intervals, the finished value of the gate length becomes consistent surely even without performing gate mask correction by OPT. However, this lowers outstandingly the flexibility of design, inviting degradation of circuit characteristics and an increase in chip area. Under the circumstances, means is desired to be established which can suppresses dispersion of gate length by the optical proximity effect even with arbitrary gate length and arbitrary gate intervals.

A related technique is disclosed in Japanese Patent Application Laid Open Publication No. 10-32253A, for example.

As described above, the gate length is shortened in association with development of transistor miniaturization, and the influence of the optical proximity effect by diffracted light becomes significant in gate exposure. The OPC technique remarkably improves dependency of the finished dimension of the gate length, which varies due to the influence of the optical proximity effect, on a neighboring pattern. However, the dependency of the finished dimension of the gate length on the neighboring pattern cannot be correct thoroughly in all standard cells. Further, if the gate length and/or gate intervals are equalized for insisting on improving correction accuracy through the OPC technique, the flexibility of design would be too limited.

SUMMARY OF THE INVENTION

The present invention has its object of suppressing dispersion of gate length by optical proximity effect in a semiconductor integrated circuit of which flexibility of design of gate length and/or gate intervals is ensured.

In the present invention, a space between a transistor to be active and a gate adjacent thereto is set wide in forming a semiconductor integrated circuit. Specifically, a distance between a transistor to be active in a standard cell and a gate adjacent thereto or a distance between a transistor to be active in a standard cell and a cell frame of the standard cell is set large. Alternatively, a spacer standard cell including no transistor to be active is arranged adjacent to a standard cell including a transistor to be active.

More specifically, a semiconductor integrated circuit according to the present invention includes: a first transistor which is formed of a first gate extending in a first direction and a first diffusion region and which is capable of being active; a second transistor which is formed of a second gate extending in the first direction and a second diffusion region and which is arranged adjacent to the first transistor in a second direction intersected at a right angle with the first direction; and a third gate which extends in the first direction and which is arranged adjacent in the second direction to the first transistor on an opposite side to the second transistor, wherein a space between the first gate and the second gate is larger than a space between the first gate and the third gate.

With the above semiconductor integrated circuit, arrangement of a gate around the first gate is limited, suppressing dispersion of gate length of the first gate which would be caused by the optical proximity effect.

Another semiconductor integrated circuit according to the present invention includes: a first transistor which is formed of a first gate extending in a first direction and a first diffusion region and which is capable of being active; a second transistor which is formed of a second gate extending in the first direction and a second diffusion region and which is arranged adjacent to the first transistor in a second direction intersected at a right angle with the first direction; and a third transistor which is formed of a third gate extending in the first direction and a third diffusion region separated from the first diffusion region and which is arranged adjacent to the first transistor on an opposite side to the second transistor, wherein a space between the first gate and the second gate is larger than a space between the first gate and the third gate.

A standard cell according to the present embodiment includes: a first transistor formed of a first gate extending in a first direction and a diffusion region and is capable of being active; and a second gate which extends in the first direction and which is arranged adjacent to the first transistor in a second direction intersected at a right angle with the first direction, wherein the first transistor is a transistor arranged the nearest, in the second direction, a first cell frame part extending in the first direction in a cell frame of the standard cell, and a space between the first gate and the first cell frame part is larger than a space between the first gate and the second gate.

Another standard cell according to the present invention includes: a first transistor which is formed of a first gate extending in a first direction and a first diffusion region and which is capable of being active; and a second transistor which is formed of a second gate and a second diffusion region and which is arranged adjacent to the first transistor in a second direction intersected at a right angle with the first direction, the second gate extending in the first direction, and the second diffusion region being separated from the first diffusion region, wherein the first transistor is a transistor arranged the nearest, in the second direction, a first cell frame part extending in the first direction in a cell frame of the standard cell, and a space between the first gate and the first cell frame part is larger than a half of a space between the first gate and the second gate.

A semiconductor integrated circuit designing method according to the present invention includes: a placement step of placing standard cells each including a transistor capable of being active; and a spacer placement step of placing a spacer standard cell including no transistor capable of being active so as to be adjacent to each side of a specified standard cell of the standard cells.

Semiconductor integrated circuit designing equipment according to the present invention includes: placement means for placing standard cells each including a transistor capable of being active; and spacer placement means for placing a spacer standard cell including no transistor capable of being active so as to be adjacent to each side of a specified standard cell of the standard cells.

As described above, the present invention limits a neighboring gate pattern to be arranged adjacent to a gate pattern including the transistor to be active as a correction target in OPC processing, so that dispersion of finished shape of the gate pattern as a correction target can be suppressed compared in the case where an arbitrary neighboring pattern is assumed to be arranged.

DESCRIPTION OF PREFERRED EMBODIMENTS

Figure 1:
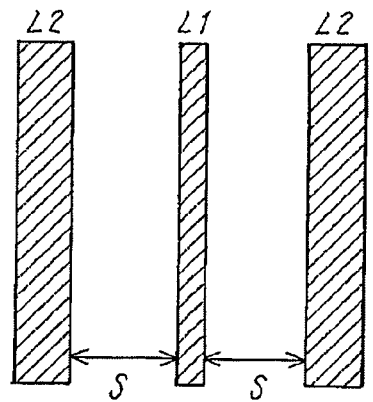
FIG. 1 is a plan view showing an example of a layout pattern of gates.

Embodiments of the present invention will be described below in detail with reference to the accompanying drawings.

In the present description, an "active transistor" means a transistor that is not a non-active transistor, in other words, a transistor capable of being active. The "non-active transistor" means a transistor which is not expected to perform a desired circuit function based on its operation characteristic. Dispersion of gate dimension of the non-active transistors involves no practical problem in a desired circuit function. The mere "transistor" includes both the active transistor and the non-active transistor.

The non-active transistor includes the followings:

(1) A P-channel transistor of which gate potential is fixed to a power supply potential or an N-channel transistor of which gate potential is fixed to a ground potential, wherein the transistor is kept in an OFF state (hereinafter referred to as an off transistor)

(2) A P-channel transistor of which gate potential is fixed to a ground potential and of which source potential and drain potential are fixed to a power supply potential or an N-channel transistor of which gate potential is fixed to a power supply potential and of which source potential and drain potential are fixed to a ground potential, wherein the transistor operates as a capacitor between the power supply and the ground (hereinafter referred to as capacitance transistor)

(3) A transistor so set that no current is allowed to flow by fixing the source potential and the drain potential thereof to the same potential Further, the "gate" includes a gate of a transistor formed of polysilicon or the like, a dummy gate formed of polysilicon or the like on a region other than a diffusion region, and a wiring made of the same material as that of a gate of a transistor on a region other than a diffusion region.

OPC processing is performed with a neighboring gate pattern included within a range of a radius r with a gate pattern to be corrected as a center taken into consideration. The more the radius r is increased, the more neighboring gate patterns that involve influence of the optical proximity effect can be taken into consideration. This increases correction accuracy while increasing a processing amount because of the widened range to be considered. In contrast, with too small radius r, the influence of the optical proximity effect is less taken into consideration, presenting a problem in correction accuracy.

Under the circumstances, in general, the distance between the gate to be corrected and a neighboring gate which allows influence of the optical proximity effect on dispersion of finished dimension of the gate to be corrected to be ignorable is determined, and the radius r is set so as to balance the accuracy and the processing amount. It is general that the radius r is set so that the dispersion of finished shape of the gate pattern to be corrected falls within a desired range through OPC even if the neighboring gate pattern included within the range of the radius r has any shape.

If the neighboring gate pattern included within in the range of the radius r could be limited, dispersion of finished shape of the gate pattern can be suppressed compared with the case where it is assumed that any arbitrary neighboring pattern would be arranged within the range of the radius r. The grounds are as follows. For example, in the case where a gate having extremely large gate length is arranged adjacent to a gate pattern to be corrected, dispersion of finished dimension of the gate to be corrected becomes large compared with the case where gates having the same gate length are arranged regularly at regular intervals and the case where a neighboring gate pattern is not arranged too near the gate pattern to be corrected. However, when a device is provided so as not to arrange a gate causing such large dispersion around the gate to be corrected, the dispersion can be suppressed.

Figure 2:
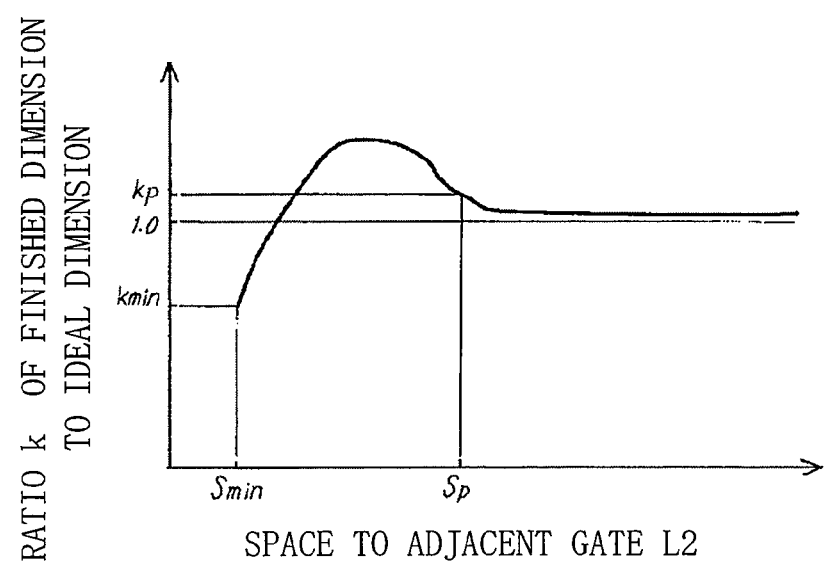
FIG. 2 is a characteristic graph showing a finished dimension of gate length with respect to a space from an adjacent gate.

Further detailed description will be made with reference to FIG. 1 and FIG. 2. FIG. 1 is a plan view showing an example of a layout pattern of gates. The gate length of two gates L2 is larger than the gate length of a gate L1. FIG. 2 is a characteristic graph showing a finished dimension of the gate length with respect to a space from an adjacent gate. In FIG. 2, the axis of abscissa indicates a space S between the gate L1 and each gate L2 while the axis of ordinates indicates a ratio k of a finished dimension of the gate length of the gate L1 to an ideal pattern dimension of the gate length of the gate L1. Herein, the "ideal pattern dimension of the gate length" means a dimension of the gate length in the case where gates having a minimum gate length are arranged regularly at regular minimum intervals so that dispersion of the gate length by the optical proximity effect is suppressed to a minimum.

As shown in FIG. 2, when the space S is set to a minimum value Smin defined by a design rule, the finished dimension of the gate length of the gate L1 is kmin times as small as the ideal pattern dimension (kmin<1), which means that error between the layout dimension and the finished pattern dimension on a semiconductor integrated circuit is very large. In contrast, when the space S is so set large to be a value Sp, the finished dimension of the gate length of the gate L1 is slightly larger than one time, that is, approximately kp times the ideal pattern dimension.

This is because: with a larger space between the gate L1 and the gate L2, the influence of the gate L2 on the gate L1 by the optical proximity effect is reduced. Thus, a large distance between adjacent gates can suppress dispersion of a finished dimension of the gate length even with an adjacent gate having a large width. Further, an arrangement in which the space between the gate L1 and the gate L2 is set large and a dummy gate is inserted therebetween can be deemed as an arrangement similar to an arrangement in which gates having the same length are arranged at regular intervals within the range of a radius r, so that the influence of the gate L2 on the gate L1 by the optical proximity effect can be reduced similarly.

General semiconductor integrated circuit designs assume that a layout dimension and an actual pattern dimension on a semiconductor integrated circuit agree with each other or are different by a given offset value. If the finished pattern dimension would be different from this assumption, deficiency that an actual semiconductor integrated circuit is inoperable would be caused even though the operation is confirmed in timing verification in the design. For this reason, it is significant to suppress dispersion of gate length by reducing the influence by the optical proximity effect so as to obtain a desired pattern shape.

Embodiment 1

Figure 3:
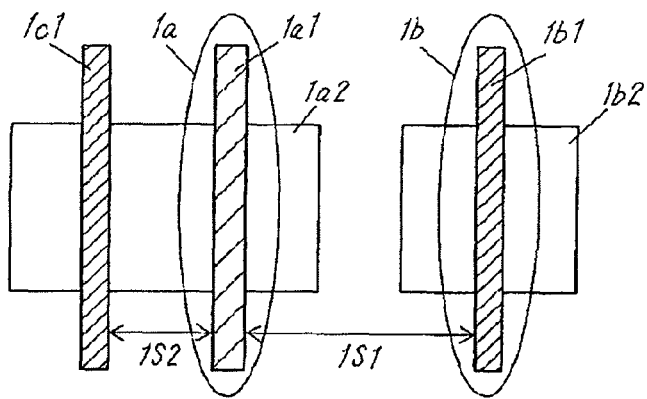
FIG. 3 is a layout diagram showing a layout pattern of a semiconductor integrated circuit according to Embodiment 1 of the present invention.

FIG. 3 is a layout diagram showing a layout pattern of a semiconductor integrated circuit according to Embodiment 1 of the present invention. In FIG. 3, a transistor 1b and a gate 1c1 are arranged on the respective sides of an active transistor 1a. The active transistor 1a is formed of a gate 1a1 and a diffusion region 1a2 while the transistor 1b is formed of a gate 1b1 and a diffusion region 1b2. The transistor 1b and the gate 1c1 are arranged adjacent to the active transistor 1a in a direction intersected at a right angle with a direction that the gate 1a1 extends.

The gate 1a1, the gate 1b1, and the gate 1c1 are arranged so that a space 1S1 between the gate 1a1 and the gate 1b1 is larger than a space 1S2 between the gate 1a1 and the gate 1c1 (for example, the space 1S1 is set so as to be two times, preferably, three times or more the space 1S2). The arrangement in which the space between the gate 1a1 and the gate 1b1 is set wide reduces the optical proximity effect that the gate 1b1 of the transistor 1b gives to the gate 1a1 of the active transistor 1a, suppressing dispersion of a finished dimension of the gate 1a1.

Embodiment 2

Figure 4:
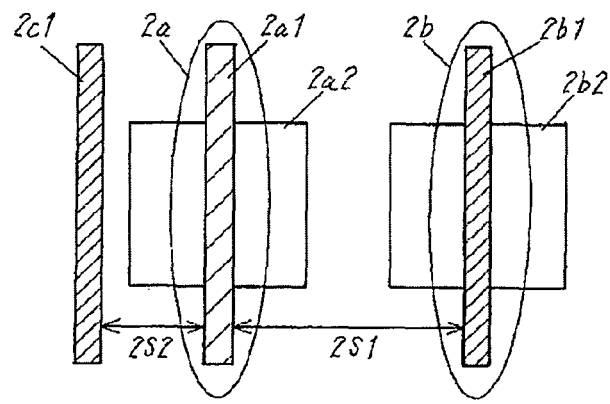
FIG. 4 is a layout diagram showing a layout pattern of a semiconductor integrated circuit according to Embodiment 2 of the present invention.

FIG. 4 is a layout diagram showing a layout pattern of a semiconductor integrated circuit according to Embodiment 2 of the present invention. In FIG. 4, an active transistor 2a is formed of a gate 2a1 and a diffusion region 2a2 while a transistor 2b is formed of a gate 2b1 and a diffusion region 2b2.

Difference of FIG. 4 from FIG. 3 lies in that a dummy gate 2c1 is provided in lieu to the gate 1c1. Even with the dummy gate 2c1, the arrangement in which the space between the gate 2a1 and the gate 2b1 is set wide attains the same effects as those in Embodiment 1.

Embodiment 3

Figure 5:
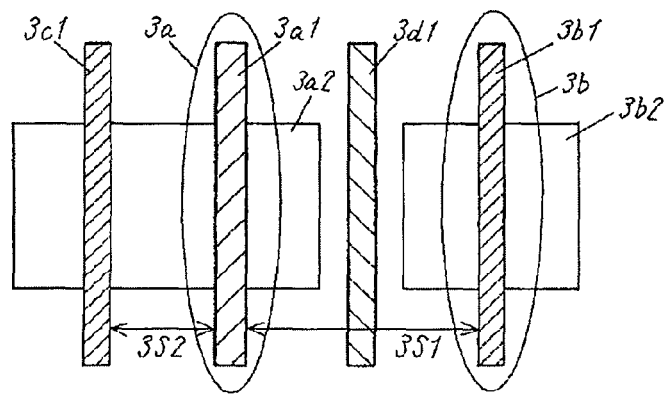
FIG. 5 is a layout diagram showing a layout pattern of a semiconductor integrated circuit according to Embodiment 3 of the present invention.

FIG. 5 is a layout diagram showing a layout pattern of a semiconductor integrated circuit according to Embodiment 3 of the present invention. In FIG. 5, an active transistor 3a is formed of a gate 3a1 and a diffusion region 3a2 while a transistor 3b is formed of a gate 3b1 and a diffusion region 3b2.

Difference of FIG. 5 from FIG. 3 lies in that a dummy gate 3d1 is arranged in parallel to the gate 3a1 between the gate 3a1 of the active transistor 3a and the gate 3b1 of the transistor 3b. When the additional gate 3d1 is interposed between the gate 3a1 of the active transistor 3a and the gate 3b1 of the transistor 3b, as shown in FIG. 5, influence of dimensional dispersion by the optical proximity that the gate 3b1 of the transistor 3b gives to the gate 3a1 of the active transistor 3a can be suppressed further than that in Embodiment 1.

Embodiment 4

Figure 6:
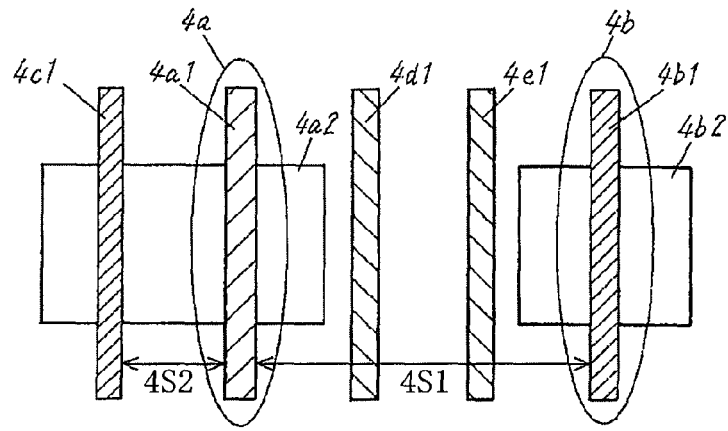
FIG. 6 is a layout diagram showing a layout pattern of a semiconductor integrated circuit according to Embodiment 4 of the present invention.

FIG. 6 is a layout diagram showing a layout pattern of a semiconductor integrated circuit according to Embodiment 4 of the present invention. In FIG. 6, a transistor 4b and a gate 4c1 are arranged on the respective sides of an active transistor 4a. The active transistor 4a is formed of a gate 4a1 and a diffusion region 4a2 while the transistor 4b is formed of a gate 4b1 and a diffusion region 4b2. Dummy gates 4d1, 4e1 are arranged in parallel to the gate 4a1 between the active transistor 4a and the transistor 4b.

The gates are arranged so that a space 4S1 between the gate 4a1 and the gate 4b1 is set longer than a space 4S2 between the gate 4a1 and the gate 4c1. FIG. 6 is different from FIG. 5 in that a plurality of dummy gates are arranged between the gate 4a1 of the active transistor 4a and the gate 4b1 of the transistor 4b. An increase in number of the gates between the transistors suppresses the influence of dispersion of finished dimension by the optical proximity that the gate 4b1 of the transistor 4b gives to the gate 4a1 of the active transistor 4a.

It is noted that when the gates 4a1, 4b1, 4c1 and the dummy gates 4d1, 4e1 are set equal to one another in gate length and are arranged at regular intervals, dispersion of a finished gate dimension by the optical proximity effect can be suppressed further. With this arrangement, the space 4S1 is three times or more the space 4S2.

Embodiment 5

Figure 7:
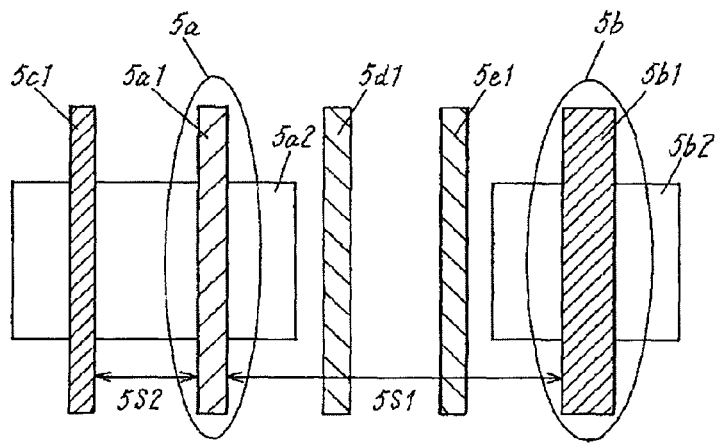
FIG. 7 is a layout diagram showing a layout pattern of a semiconductor integrated circuit according to Embodiment 5 of the present invention.

An example in which Embodiment 4 is more effective will be described as Embodiment 5. FIG. 7 is a layout diagram showing a layout pattern of a semiconductor integrated circuit according to Embodiment 5 of the present invention. An active transistor 5a is formed of a gate 5a1 and a diffusion region 5a2 while a transistor 5b is formed of a gate 5b1 and a diffusion region 5b2. Dummy gates 5d1, 5e1 are arranged in parallel to the gate 5a1 between the active transistor 5a and the transistor 5b. A gate 5c1 is arranged similarly to the gate 4c1 in FIG. 6.

FIG. 7 is different from FIG. 6 in that the gate length of the gate 5b1 of the transistor 5b is larger than the gate length of the gate 5a1 of the active transistor 5a. The transistor having a larger gate length is used as, for example, a capacitance transistor usually. This is because a capacitance transistor having a minimum gate length increases an area between gates to make it difficult to increase the capacitance per unit area. In contrast, with a larger gate length, a capacitance transistor having a large capacitance per unit area can be obtained.

However, gates having larger gate lengths such as the gate 5b1 in FIG. 7 involve significant influence on dispersion of finished dimension by the optical proximity that a gate of an adjacent transistor receives. Under the circumstances, in order to suppress the influence, the space between the gate 5a1 and the gate 5b1 is set wide as in the present embodiment. This suppresses the influence of dispersion of a finished dimension by the optical proximity that the gate 5b1 of the transistor 5b gives to the gate 5a1 of the active transistor 5a.

It is noted that when the gates 5a1, 5b1, 5c1 and the dummy gates 5d1, 5e1 in FIG. 7 are set equal to one another in gate length and are arranged at regular intervals, dispersion of a finished dimension by the optical proximity effect can be suppressed further.

It is also noted that the present invention is not limited to a capacitance transistor, which is though referred to as an example of a transistor having a larger gate length.

Embodiment 6

Figure 8:
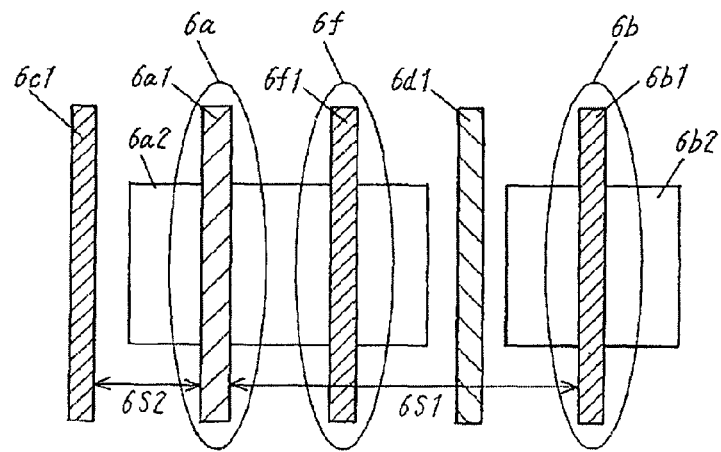
FIG. 8 is a layout diagram showing a layout pattern of a semiconductor integrated circuit according to Embodiment 6 of the present invention.

FIG. 8 is a layout diagram showing a layout pattern of a semiconductor integrated circuit according to Embodiment 6 of the present invention. In FIG. 8, a transistor 6b and a dummy gate 6c1 are arranged on the respective sides of an active transistor 6a. The active transistor 6a is formed of a gate 6a1 and a diffusion region 6a2 while the transistor 6b is formed of a gate 6b1 and a diffusion region 6b2.

A dummy gate 6d1 is arranged in parallel to the gate 6a1 between the active transistor 6a and the transistor 6b. Further, between the active transistor 6a and the transistor 6b, a non-active transistor 6f is arranged which is formed of a gate 6f1 and the diffusion region 6a2. With this arrangement, the finger length (a distance from the center of a channel to the end of an active region) with respect to the gate 6a1 of the active transistor 6a becomes large, obtaining an effect of suppressing characteristic variation of the active transistor 6a, in addition to the effects described in Embodiment 4. The reasons why such effects can be obtained will be described in detail below.

The difference in thermal expansion coefficient between an active region and an element isolation region causes stress in thermal treatment, which is called STI (Shallow Trench Isolation) stress in general. The thermal expansion coefficient of the active region is larger than that of the element isolation region, and therefore, compression stress is caused in the active region after thermal treatment. The compression stress deforms the band of the active region to change the mobility of the channel charge, varying the transistor characteristic. A transistor with a small active region, especially, with a small finger length varies in characteristic significantly. While, with the non-active transistor 6f provided, the characteristic variation of the active transistor 6a of which rightward finger length is large is suppressed.

The non-active transistor 6f is arranged nearer the transistor 6b than the active transistor 6a is and has a small finger length, so that the non-active transistor 6f receives the influence of dispersion of a finished dimension and varies in characteristic significantly. However, this transistor is a non-active transistor such as a capacitance transistor or an off-transistor and, therefore, does not contribute to realization of a desired function of a circuit with no problem involved.

It is noted that when the gates 6a1, 6b1, 6c1 and the dummy gates 6d1, 6f1 are set equal to one another in gate length and are arranged at regular intervals, dispersion of a finished gate dimension by the optical proximity effect can be suppressed further.

Embodiment 7

Figure 9:
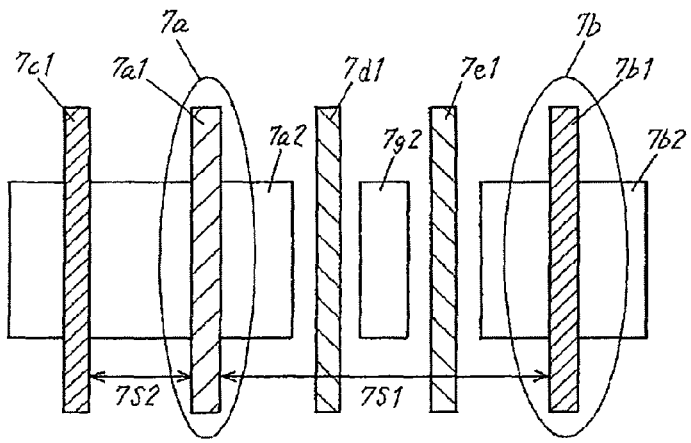
FIG. 9 is a layout diagram showing a layout pattern of a semiconductor integrated circuit according to Embodiment 7 of the present invention.

FIG. 9 is a layout diagram showing a layout pattern of a semiconductor integrated circuit according to Embodiment 7 of the present invention. In FIG. 9, a transistor 7b and a gate 7c1 are arranged on the respective sides of an active transistor 7a. The active transistor 7a is formed of a gate 7a1 and a diffusion region 7a2 while the transistor 7b is formed of a gate 7b1 and a diffusion region 7b2. Dummy gates 7d1, 7e1 are arranged in parallel to the gate 7a1 between the active transistor 7a and the transistor 7b. Further, a dummy diffusion region 7g2 is arranged between the dummy gate 7d1 and the dummy gate 7e1. Description of effects obtained by arranging the dummy diffusion region in such a fashion will be made in detail below.

A semiconductor integrated circuit is manufactured by forming a circuit pattern on a silicon wafer through film formation, photolithography, etching, and the like. Recently, for realizing high-speed and high-density semiconductor devices, miniaturization and multi-layer application progress in technology of circuit patterns. This leads to tendency to increase surface roughness of a wafer on which a circuit pattern is formed in the manufacturing process. The surface roughness of the wafer makes difficult to perform excellent exposure essential to wiring formation and the like, and therefore, planarization of the wafer surface is performed. In the planarization process, CMP (Chemical Mechanical Polishing) is employed which realizes planarization by chemically and mechanically polishing the surface.

Mere introduction of the CMP process, however, cannot attain desired planarization in many cases. For example, it is well known that the film thickness after polishing is different part from part because of local difference in pattern density in a semiconductor integrate circuit. With large step difference, thorough planarization could not be attained, causing unevenness in film thickness after the CMP process. Significant unevenness causes failure.

For this reason, various schemes are developed for preventing unevenness in film thickness from being caused, one typical example of which is insertion of a dummy pattern. One of significant factors of the unevenness in film thickness after polishing is that a concave part is formed in a part where a trench is formed after insulating film formation. In order to prevent such a concave part from being formed, a pattern (a dummy pattern) actually playing no role as an element is provided for eliminating the step difference in the surface portion, so that thorough planarization after polishing can be contemplated. Provision of a dummy pattern in a wide trench portion attains further planarization after polishing (see Japanese Patent Application Laid Open Publication No. 2004-273962A).

As described above, arrangement of the dummy diffusion region allows the pattern density of diffusion regions to be averaged, suppressing the roughness caused in planarization by CMP to attain an exposure process with high precision.

In Embodiment 7, when a dummy metal wiring is arranged rather than the dummy diffusion region, the pattern density of metal wirings becomes averaged for the same reason.

A substrate contact is formed of a diffusion region, a contact, and a metal wiring in general. Accordingly, in Embodiment 7, when a substrate contact region is arranged rather than the dummy diffusion region, the pattern densities of diffusion regions and metal regions become averaged for the same reason. In addition, the substrate potential can be stabilized.

Further, in Embodiment 3 to 7, a dummy gate, a non-active transistor, a dummy diffusion region, a dummy metal region, or a substrate contact region is arranged between the active region and the transistor adjacent thereto. However, several of them may be arranged therebetween in combination, as in Embodiment 7.

Desirably, the circuits in Embodiment 1 to 7 are circuits that propagate a clock signal. Because, an active transistor included in a circuit that propagates a clock signal is especially required to have a highly accurate gate dimension. The reason therefor will be described in detail below.

In general, a clock signal is distributed and supplied for synchronizing a semiconductor integrated circuit. Conventionally, in order to distribute the clock signal with a smaller clock skew to multiple resistors or the like, the delay thereof is adjusted by a delay element, routing, or the like or by making the circuit structures for clock transmission to the resisters or the like to be identical.

Currently employed large-size semiconductor integrated circuits include multiple resisters and the like, so that a clock signal must be distributed to the multiple resisters or the like. Accordingly, the circuits for distributing a clock signal are composed of several stages of gates. Therefore, even if the clock distributing circuits would be made identical in a semiconductor integrated circuit, dispersion in the process of manufacturing a semiconductor integrated circuit would be accompanied by dispersion of delay time of the clock distributing circuits, resulting in a clock skew generated between clocks distributed to the resistors or the like.

Particularly, for miniaturization, the clock cycle becomes short, and dispersion in the manufacturing process becomes large, presenting a problem that a skew occupies large in the clock cycle. Under the circumstances, dimension accuracy, especially, of gates of transistors in a circuit that propagates a clock signal is demanded to be increased. In general, the circuit that propagates a clock signal functions as an inverter circuit or a buffer circuit. In each of the embodiments of the present invention, the same is applied.

It is needless to say that Embodiments 1 to 7 is effective in not only a circuit that propagates a clock signal but also in any circuits used on a signal path requiring highly precise signal propagation.

Embodiment 8

Figure 10:
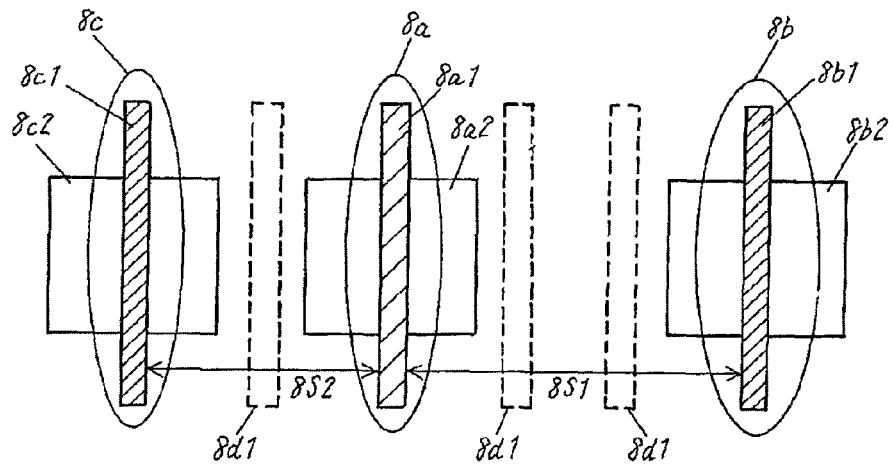
FIG. 10 is a layout diagram showing a layout pattern of a semiconductor integrated circuit according to Embodiment 8 of the present invention.

FIG. 10 is a layout diagram showing a layout pattern of a semiconductor integrated circuit according to Embodiment 8 of the present invention. In FIG. 10, a transistor 8b and a transistor 8c are arranged on the respective sides of an active transistor 8a. The active transistor 8a is formed of a gate 8a1 and a diffusion region 8a2, the transistor 8b is formed of a gate 8b1 and a diffusion region 8b2, and the transistor 8c is formed of a gate 8c1 and a diffusion region 8c2.

The gates 8a1, 8b1, 8c1 are arranged so that a space 8S1 between the gate 81a and the gate 8b1 is larger than a space 8S2 between the gate 8a1 and the gate 8c1 (for example, the space 8S1 is set so as to be 1.5 times or more the space 8S2). Significant difference of Embodiment 8 from Embodiments 1 to 7 lies in that no dummy gate 8d1 is provided. Though dummy gates 8d1 are indicted by dotted lines in FIG. 10 for the sake of easy understanding, the dummy gate 8d1 is not provided on the layout pattern in FIG. 10.

In Embodiments 1 to 7, dispersion of a finished gate dimension is suppressed by widening the space between the gates of the transistors and arranging the gates at regular intervals with the use of the dummy gates. While in Embodiment 8, dispersion of a finished gate dimension is suppressed only by widening the space between the gates of the transistors without using such a dummy gate. The layout in which the space is widened as in the present embodiment suppresses the influence of dispersion of a finished dimension by the optical proximity effect that the gate 8b1 of the transistor 8b gives to the gate 8a1 of the active transistor 8a.

It is noted that when the gates 8a1, 8b1, 8c1 are set equal to each other in gate length in Embodiment 8, dispersion of a finished gate dimension by the optical proximity effect can be suppressed further.

In addition, dimension accuracy of finished gate length can be increased in Embodiment 8, and therefore, Embodiment 8 is effective especially in the case where the active transistor 8a is included in a circuit that propagates a clock signal. The reason therefor has been already described and the description thereof is omitted here.

Embodiment 9

Figure 11:
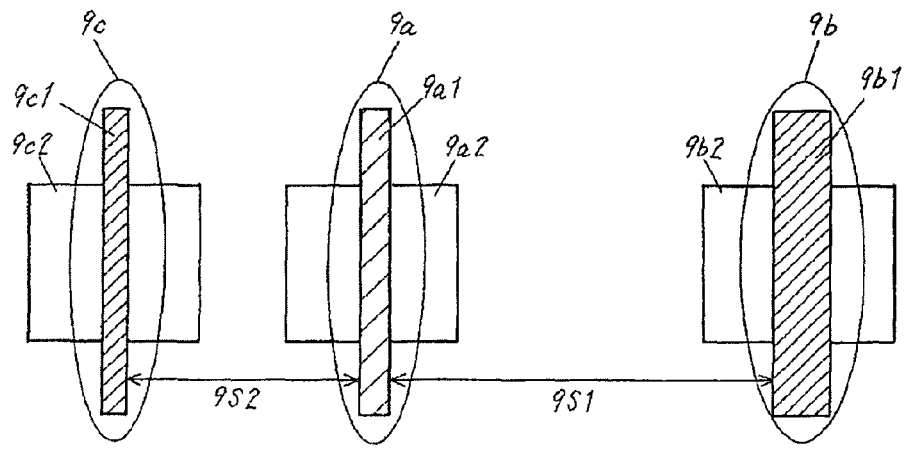
FIG. 11 is a layout diagram showing a layout pattern of a semiconductor integrated circuit according to Embodiment 9 of the present invention.

FIG. 11 is a layout diagram showing a layout pattern of a semiconductor integrated circuit according to Embodiment 9 of the present invention. In FIG. 11, similarly to FIG. 10, a transistor 9b and a transistor 9c are arranged on the respective sides of an active transistor 9a. The active transistor 9a is formed of a gate 9a1 and a diffusion region 9a2, the transistor 9b is formed of a gate 9b1 and a diffusion region 9b2, and the transistor 9c is formed of a gate 9ca and a diffusion region 9c2. FIG. 11 is different from FIG. 10 in that the gate length of the gate 9b1 of the transistor 9b is larger than each gate length of the gate 9a1 of the active transistor 9a and the gate 9c1 of the transistor 9c.

Although an increase in gate length as the above gate 9b1 leads to arrangement of a capacitance transistor with enhanced area efficiency, this brings significant influence of dispersion of a finished dimension by the optical proximity effect to an adjacent transistor. Therefore, a space 9S1 between the gate 9a1 and the gate 9b1 in FIG. 11 is set larger than the space 8S1 between the gate 8a1 and the gate 8b1 in FIG. 10 to suppress the influence of dispersion of a finished dimension by the optical proximity effect that the gate 9b1 of the transistor 9b gives to the gate 9a1 of the active transistor 9a.

It is noted that the capacitance transistor is referred to as an example of a transistor having a large gate length, but the present embodiment is not limited thereto.

Embodiment 10

Figure 12:
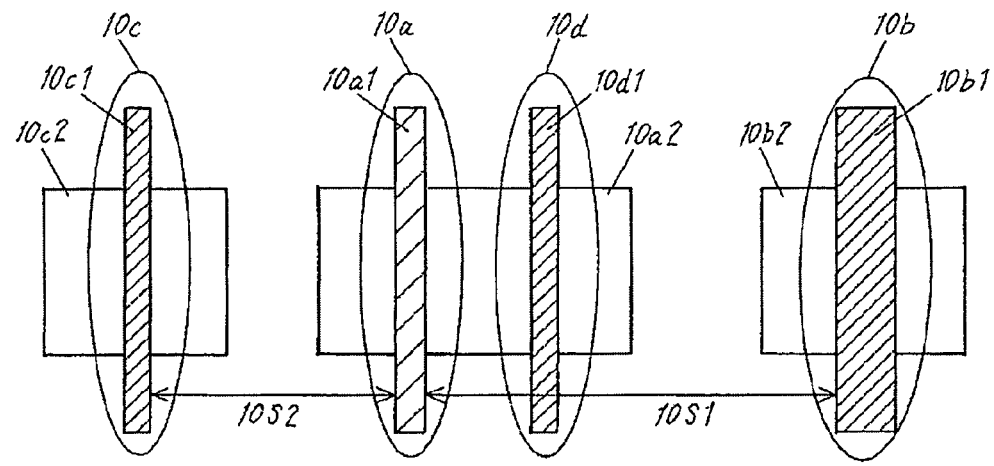
FIG. 12 is a layout diagram showing a layout pattern of a semiconductor integrated circuit according to Embodiment 10 of the present invention.

FIG. 12 is a layout diagram showing a layout pattern of a semiconductor integrated circuit according to Embodiment 10 of the present invention. In FIG. 12, similar to FIG. 11, a transistor 10b and a transistor 10c are arranged on the respective sides of an active transistor 10a. The active transistor 10a is formed of a gate 10a1 and a diffusion region 10a2, the transistor 10b is formed of a gate 10b1 and a diffusion region 10b2, and the transistor 10c is formed of a gate 10c1 and a diffusion region 10c2. The gates 10a1, 10b1, 10c1 correspond to the gates 9a1, 9b1, 9c1 in FIG. 11, respectively. An active transistor 10d formed of a gate 10d1 and the diffusion region 10a2 is arranged between the active transistor 10a and the transistor 10b.

With the above arrangement, the influence of dispersion of a finished dimension by the optical proximity effect that the gate 10b1 of the transistor 10b gives to the gate 10a1 of the active transistor 10a is suppressed further than a case without the non-active transistor 10d. Further, the finger length with respect to the gate 10a1 of the active transistor 10a becomes large in Embodiment 10, suppressing characteristic variation of the active transistor 10a, as described in Embodiment 6. In addition, Embodiment 10 is the same as Embodiment 6 in that each increase in dispersion of a finished dimension and in characteristic variation of the non-active transistor 10d involves no problem. It is noted that the gates 10a1, 10b1, 10d1 may be set equal in gate length with one another, which enables further suppression of dispersion of a finished gate dimension by the optical proximity effect.

Embodiment 11

Figure 13:
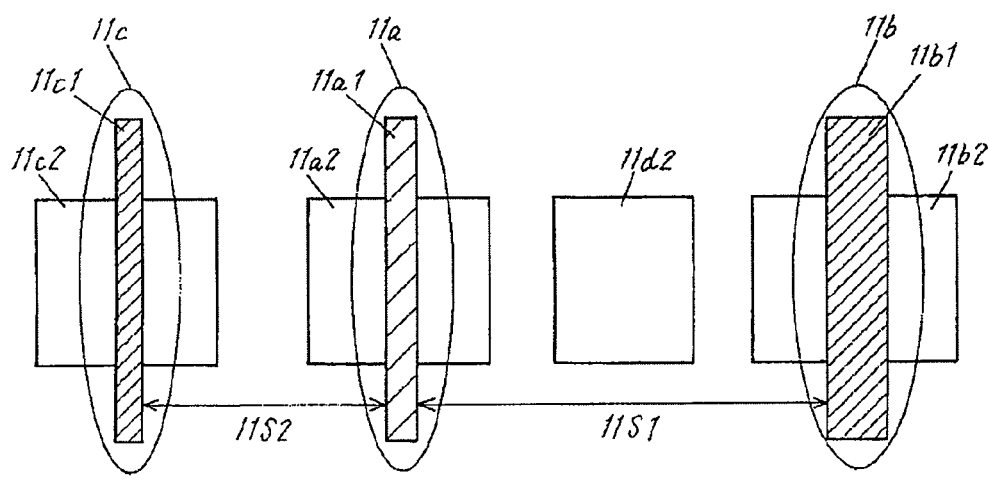
FIG. 13 is a layout diagram showing a layout pattern of a semiconductor integrated circuit according to Embodiment 11 of the present invention.

FIG. 13 is a layout diagram showing a layout pattern of a semiconductor integrated circuit according to Embodiment 11 of the present invention. In FIG. 13, similarly to FIG. 11, a transistor 11b and a transistor 11c are arranged on the respective sides of an active transistor 11a. The active transistor 10a is formed of a gate 11a1 and a diffusion region 11a2, the transistor 11b is formed of a gate 11b1 and a diffusion region 11b 2, and the transistor 11c is formed of a gate 11c 1 and a diffusion region 11c 2. The gates 11a1, 11b1, 11c1 correspond to the gates 9a1, 9b1, 9c1 in FIG. 11, respectively. A dummy diffusion region 11d2 is arranged between the active transistor 11a and the transistor 11b. By arranging the dummy diffusion region 11d2 in this way, the pattern density can be averaged, as described in Embodiment 7.

It is noted that a dummy metal wiring may be arranged rather than the dummy diffusion region in Embodiment 11. With this arrangement, averaged pattern density of metal wirings can be attained on the ground described in Embodiment 7.

Further, in Embodiment 11, a substrate contact region may be arranged rather than the dummy diffusion region. In general, a substrate contact is formed of a diffusion region, a contact, and a metal wiring. Therefore, in addition to the effect of attaining averaged pattern density of diffusion regions and metal regions, the substrate potential can be stabilized on the ground described in Embodiment 7.

Moreover, in Embodiment 11, a non-active transistor may be arranged between the active transistor 11a and the transistor 11b. Further, several of a non-active transistor, a dummy diffusion region, a dummy metal region, and a substrate contact region can be arranged therebetween in combination.

Embodiment 12

In general, layout design of a semiconductor integrated circuit is usually preformed by combining standard cells. A standard cell is a combination of a plurality of transistors as a basic unit for layout design or the like having a basic function.

The standard cell includes a transistor, a dummy gate, and the like. The standard cell functions as an inverter, a NAND, an AND, a NOR, an OR, an EXOR, a latch, a flip flop, or the like.

Through Embodiments 1 to 11, the schemes are described in which dispersion of a finished dimension of the active transistor can be suppressed by separating the gate of an active transistor from a gate adjacent thereto. In the case where chip layout design is carried out by an automatic placement tool using standard cells, the layout form of the standard cells must be taken into consideration so as to suppress dispersion of a finished dimension of active transistors located at the respective ends of a standard cell even if the standard cell would be arranged anywhere.

Specifically, in layout design for a standard cell, when transistors other than active transistors located at the respective ends of a standard cell are arranged according to the layout form described in any of the above embodiments, dispersion of a finished dimension of the transistor can be suppressed. However, it is uncertain what kind of standard cells are to be arranged adjacent to a target standard cell including at the respective ends thereof the active transistors, and therefore, the layout design of the target standard cell must be carried out with attention paid so as to form the layout form described in any of the above embodiments even though any standard cells are arranged adjacent thereto.

Figure 14:
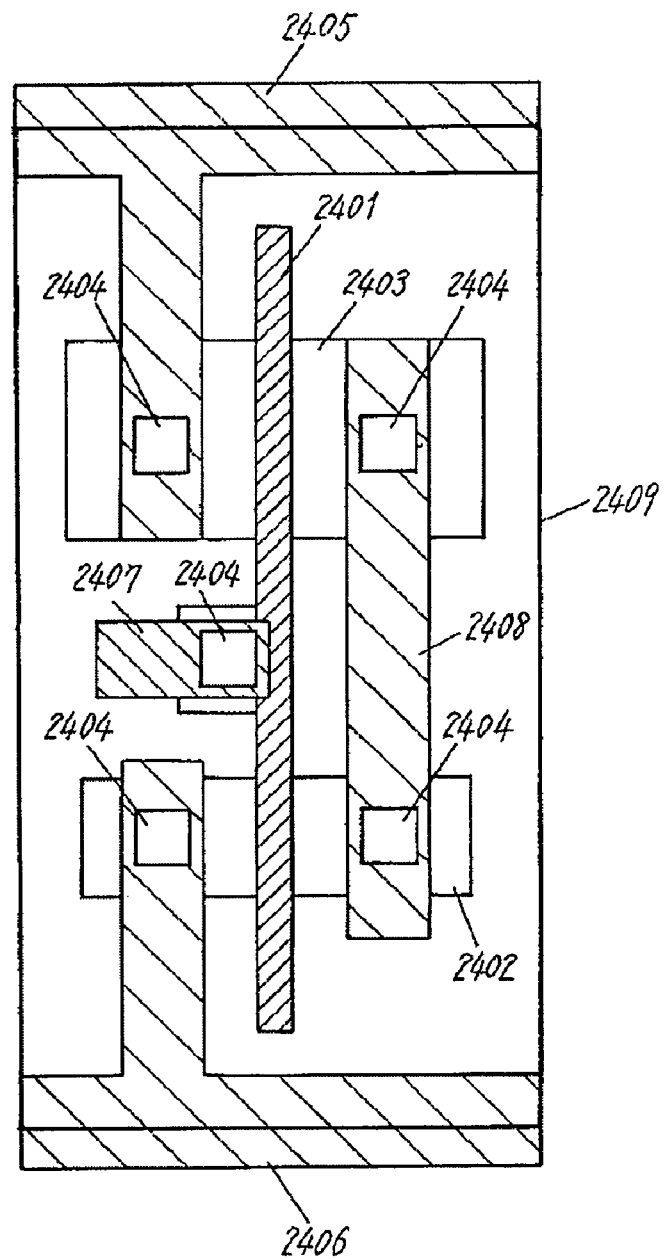
FIG. 14 is a layout diagram of an inverter as one example of a standard cell.

FIG. 14 is a layout diagram of an inverter as one example of a standard cell. The standard cell in FIG. 14 includes a P-channel transistor formed of a P+ diffusion region 2403 and a gate 2401 and an N-channel transistor formed of a N+ diffusion region 2402 and the gate 2401. An input signal from an input terminal 2407 as a metal wiring is supplied to the gate 2401 via a contact 2404. A power supply potential is supplied from a power supply wiring 2405 as a metal wiring to the source of the P-channel transistor via a contact 2404. A ground potential is supplied from a grounding wiring 2406 as a metal wiring to the source of the N-channel transistor via a contact 2404. An input signal of the input terminal 2407 is inverted and output to an output terminal 2408 as a metal wiring.

In the present and following embodiments relating to the invention directed to a standard cell, the metal wirings, the contact, and the like are omitted for the sake of simple explanation.

Further, though a general standard cell includes two transistor arrays of a P-channel transistor and an N-channel transistor, only one transistor array is referred to in the present and following embodiments for the sake of simple explanation. However, the present invention is not limited to the case with only one transistor array as referred to in the present and following embodiments and is applicable to, of course, a standard cell including two transistor arrays as in the general standard cell.

Figure 15:
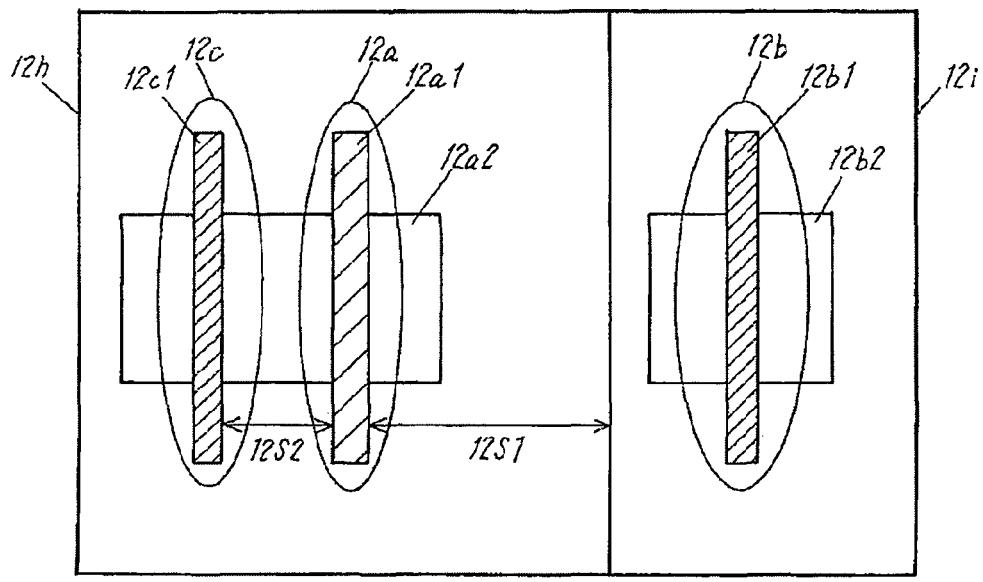
FIG. 15 is a layout diagram showing a layout pattern of a standard cell according to Embodiment 12 of the present invention.

FIG. 15 is a layout diagram showing a layout pattern of a standard cell according to Embodiment 12 of the present invention. FIG. 15 schematically shows a layout pattern in which a standard cell 15*i* is arranged adjacent to a target standard cell 12*h* according to the present invention. The standard cells 12*h*, 12*i* are arranged in contact with each other at their cell frames. The target standard cell 12*h* includes gates 12*a* 1, 12*c* 1, and a diffusion region 12*a* 2. The gate 12*c* 1 is arranged adjacent to an active transistor 12*a* formed of the gate 12*a*1 and the diffusion region 12*a* 2, and one side of the cell frame including the gates 12*a* 1, 12*c* 1 is located on the opposite side to the gate 12*c* 1. The gates are arranged so that a space 12S1 between the gate 12*a*1 and the one side of the cell frame is larger than a space 12S2 between the gate 12*a*1 and the gate 12*c* 1. With this arrangement, the distance between the gate 12*a*1 and the gate 12*b*1 becomes larger than the distance between the gate 12*a*1 and the gate 12*c* 1 even when the gate 12*b*1 is arranged anywhere in the standard cell 12*i* adjacent to the gate 12*a* 1. Hence, the influence of dispersion of a finished dimension of the gate 12*a*1 by the optical proximity effect can be suppressed.

As described in Embodiment 3, the same effects can be obtained even when the gate 12*c* 1 is a gate of a transistor or of a dummy gate.

Embodiment 13

Figure 16:
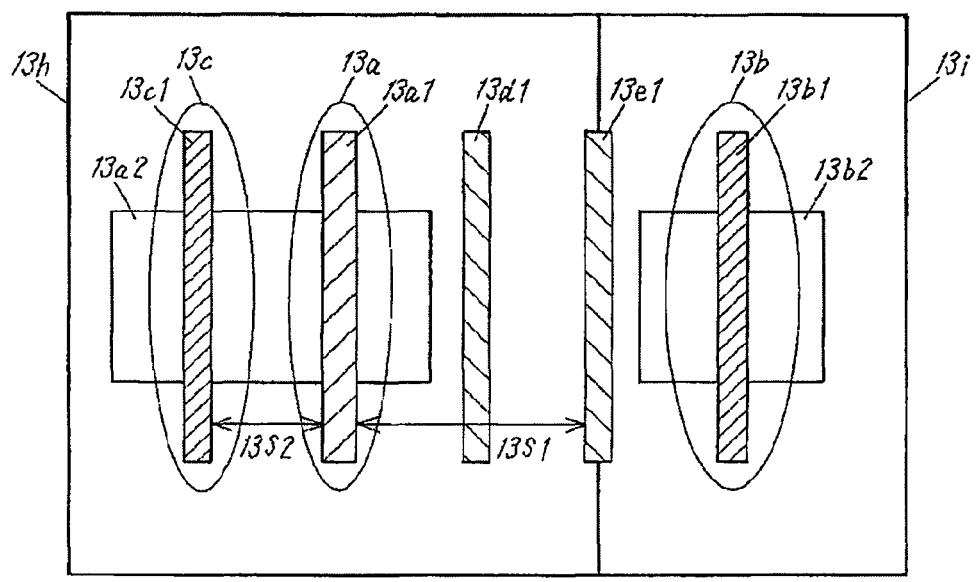
FIG. 16 is a layout diagram showing a layout pattern of a standard cell according to Embodiment 13 of the present invention.

FIG. 16 is a layout diagram showing a layout pattern of a standard cell according to Embodiment 13 of the present invention. Gates 13*a* 1, 13*b* 1, 13*c* 1 in FIG. 16 correspond to the gates 12*a* 1, 12*b*1, 12*c* 1 in FIG. 15, respectively. Difference of FIG. 16 from FIG. 15 lines in that dummy gates 13*d* 1, 13*e* 1 are arranged between an active transistor 13*a* and a cell frame of a target standard cell 13*h* and on cell frames, respectively. The dummy gate 13*e* 1 is arranged on both the cell frame of the target standard cell 13*h* and a cell frame of a standard cell 13*i* so as to be shared on the cell frames between the standard cells 13*h*, 13*i* arranged adjacent to each other.

With the above arrangement, the influence of dispersion of a finished dimension by the optical proximity effect that the gate 13*a* 1 of the active transistor 13*a* receives can be suppressed even when the gate 13*b* 1 is arranged anywhere in the standard cell 13*i*, compared with a case without the dummy gates 13*d* 1, 13*e* 1.

It is noted that the gates 13*a* 1, 13*c* 1 and the dummy gates 13*d* 1, 13*e* 1 may be set equal to one another in gate length and be arranged at regular intervals, which further suppresses dispersion of a finished gate dimension by the optical proximity effect.

Embodiment 14

Figure 17:
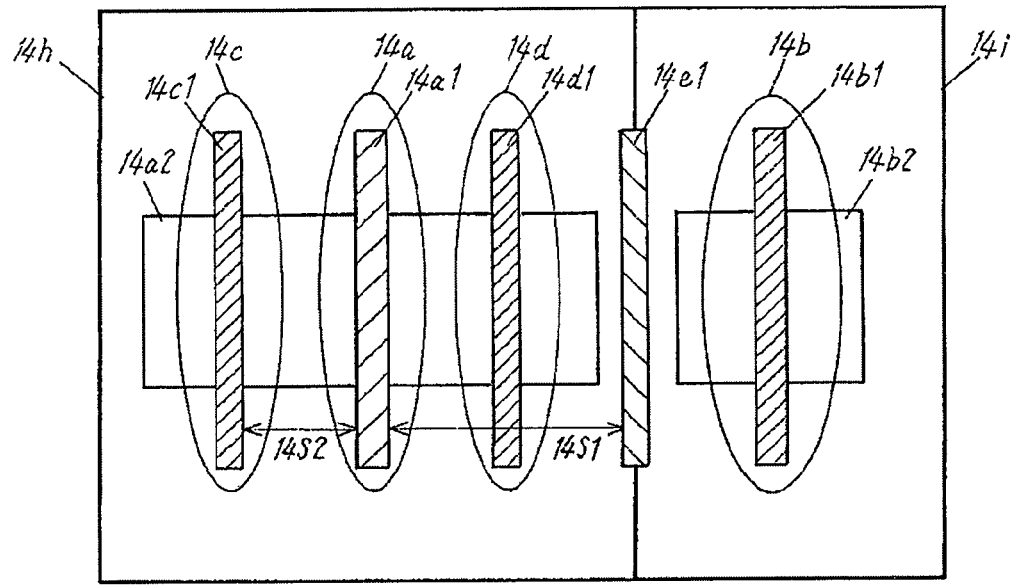
FIG. 17 is a layout diagram showing a layout pattern of a standard cell according to Embodiment 14 of the present invention.

FIG. 17 is a layout diagram showing a layout pattern of a standard cell according to Embodiment 14 of the present invention. Gates 14*a* 1, 14*b* 1, 14*c* 1 and a dummy gate 14*e*1 in FIG. 17 correspond to the gate 13*a* 1, 13*b* 1, 13*c* 1 and the dummy gate 13*e* 1 in FIG. 16, respectively. Difference of FIG. 17 from FIG. 16 lines in that a gate 14*d* 1 in FIG. 17 rather than the dummy gate 13*d* 1 in FIG. 16 is arranged to form a non-active transistor 14*d* on a diffusion region 14*a*2.

With the above arrangement, in addition to the effect of suppressing dispersion of a finished gate dimension by the optical proximity effect, the STI stress caused due to a large finger length with respect to the gate 14*a* 1 of an active transistor 14*a* can be reduced, suppressing characteristic variation of the active transistor 14*a*, as described in Embodiments 6 and 10. Further, each increase in dispersion of a finished dimension and in characteristic variation of the non-active transistor 14*d* involve no problem.

It is noted that the gates 14*a* 1, 14*c* 1, 14*d* 1, 14*e* 1 may be set equal to one another in gate length and be arranged at regular intervals, which further suppresses dispersion of a finished gate dimension length by the optical proximity effect.

Embodiment 15

Figure 18:
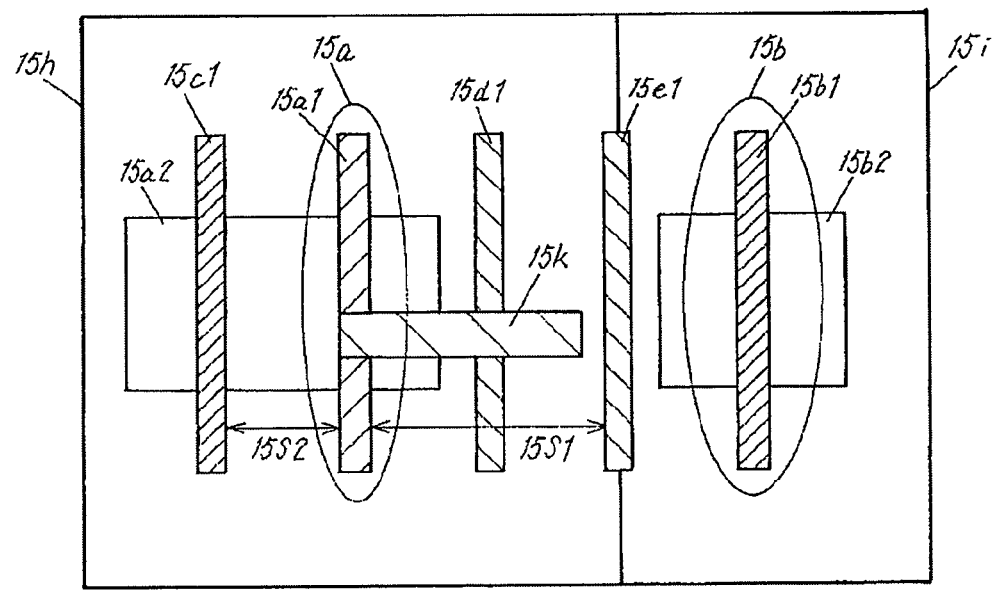
FIG. 18 is a layout diagram showing a layout pattern of a standard cell according to Embodiment 15 of the present invention.

FIG. 18 is a layout diagram showing a layout pattern of a standard cell according to Embodiment 15 of the present invention. Gates 15*a* 1, 15*b* 1, 15*c* 1 and dummy gate 15*d* 1, 15*e* 1 in FIG. 18 correspond to the gate 13*a* 1, 13*b* 1, 13*c* 1 and the dummy gate 13*d* 1, 13*e* 1 in FIG. 15, respectively. FIG. 18 is different from FIG. 16 in that a terminal region 15k to be a terminal access region in automatic placement and routing is arranged so as to overlap a region between the dummy gate 15d 1 and the dummy gate 15e 1.

In the case where the space between the active transistor at the cell end and the cell frame is set not so wide unlike the present embodiment, no sufficient empty region is formed between the dummy gate 15d 1 and the dummy gate 15e 1, and therefore, the terminal region 15k should be arranged further inside of the cell than the dummy gate 15d 1, because the terminal region 15k projecting out from the cell frame would invite short circuit between the target standard cell and an terminal region of a standard cell to be arranged adjacent thereto. Arrangement of a terminal region within a standard cell leads to closing up of the terminal region or compels contraction of the terminal region because of shortage of sufficient space for arranging the terminal region, resulting in poor wiring accessibility at automatic routing.

In contrast, as in the present embodiment, when the terminal region is arranged wide by utilizing a widened region between the active transistor at the cell end and the cell frame, closing up of the terminal region can be reduced and sufficient region for arranging the terminal region can be ensured, increasing wiring accessibility at automatic routing.

It is noted that the intra-cell terminal region 15k extends in a direction intersected at a right angle with the direction in which the gate extends in the present embodiment, but the present embodiment is effective in the case where the terminal region extends in parallel to the direction in which the gate extends.

Extension of the intra-cell terminal region 5k increases the coverage of a metal wiring with respect to a contact between a wiring layer where the terminal region 15k is formed and a wiring layer therebelow. Further, the number of contacts can be increased in some cases, which in turn suppresses the occurrence rate of operation malfunction, which would be caused due to contact failure in the manufacture.

In Embodiments 13 to 15, a dummy gate, a non-active transistor, an intra-cell terminal region, or a contact is arranged in the empty region between the cell frame and the active transistor arranged the nearest the cell frame. However, any of a dummy diffusion region, a dummy metal region, and a substrate contact region may be formed therebetween as described in Embodiment 7. Further, several of them may be formed therebetween in combination. The effects obtainable in such cases are the same as those described in Embodiment 7.

The standard cell subjected to the layout in any of Embodiments 13 to 15 is effective in a circuit that propagates a clock signal. The reason therefor has been described in Embodiment 7 and is not described here.

In Embodiments 12 to 15, only one of the cell ends is referred to, but the same layout form is applied desirably to the cell end on the opposite side. Because, standard cells are usually arranged left and right continuously at automatic placement and may have symmetric forms, and therefore, application of any of the above embodiments to only one of the cell ends cannot attain the aforementioned effects at the cell end where the embodiments are not applied. Another reason is that it is uncertain what kind of standard cell is arranged adjacent to a standard cell located at the end of the cell array.

Embodiment 16

Figure 19:
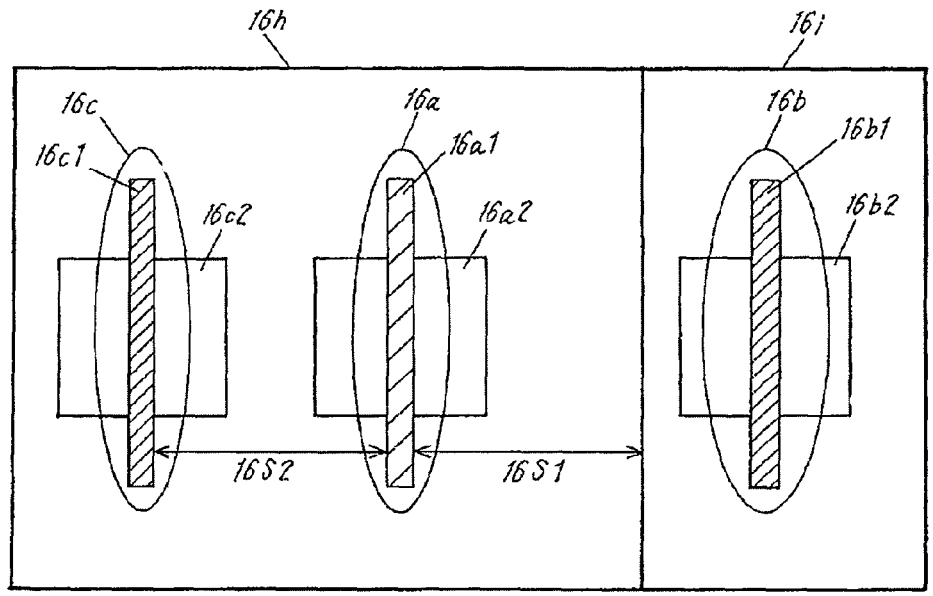
FIG. 19 is a layout diagram showing a layout pattern of a standard cell according to Embodiment 16 of the present invention.

FIG. 19 is a layout diagram showing a pattern of a standard cell according to Embodiment 16 of the present invention. FIG. 19 schematically shows a layout pattern in which a standard cell 16i is arranged adjacent to a target standard cell 16h according to the present invention. The standard cells 16h, 16i are arranged adjacent to each other with the respective cell frames being in contact with each other. The target standard cell 16h includes gates 16a 1, 16c 1 and diffusion regions 16a 2, 16c 2.

A transistor 16c formed of the gate 16c 1 and the diffusion region 16c 2 is arranged adjacent to an active transistor 16a formed of the gate 16a 1 and the diffusion region 16a 2. One side of a cell frame of the target standard cell 16h including the gates 16a 1, 16c 1 is located on the opposite side of the gate 16a 1 to the gate 16c 1. The gates are arranged so that a space 16S1 between the gate 16a 1 and the cell frame is larger than a space 16S2 between the gate 16a 1 and the gate 16c 1.

With the above arrangement, the distance between the gate 16a 1 and the gate 16b1 becomes larger than the distance between the gate 16a 1 and the gate 16c 1 even when the gate 16b1 is arranged anywhere in the standard cell 16i adjacent to the gate 16a 1. Hence, the influence of dispersion of a finished dimension of the gate 16a 1 by the optical proximity effect can be suppressed.

In the present embodiment, the gates are arranged so that the space 16S1 is larger than the space 16S2, wherein the space 16S1 may be set larger than only a half of the space 16S2. When all standard cells are designed under such the rule, the distance between the gate 16a 1 and the gate 16b1 in the adjacent standard cell becomes larger than the space 16S2 even when any standard cell is adjacent thereto. As a result, the same effects as above can be obtained.

In Embodiment 16, the gates 16a 1, 16c 1 may be set equal to each other in gate length, which further suppresses dispersion of a finished gate dimension by the optical proximity effect.

Embodiment 17

Figure 20:
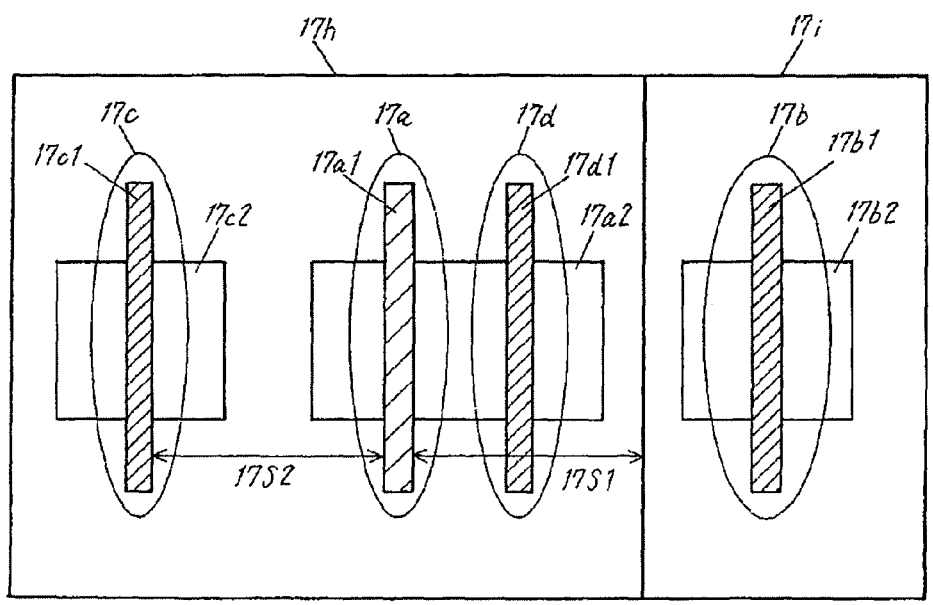
FIG. 20 is a layout diagram showing a layout pattern of a standard cell according to Embodiment 17 of the present invention.

FIG. 20 is a layout diagram showing a layout pattern of a standard cell according to Embodiment 17 of the present invention. Difference of FIG. 20 from FIG. 19 lies in that a non-active transistor 17d is arranged between an active transistor 17a and a cell frame the nearest the active transistor 17a. With this arrangement, in addition to the effect of suppressing dispersion of a finished gate dimension by the optical proximity effect, characteristic variation of the active transistor 17a can be suppressed with a large finger length with respect to the gate 17a1 of the active transistor 17a, as described in Embodiments 6 and 10. Further, as described in Embodiment 6, no problem is involved in each increase in dispersion of a finished dimension and in characteristic variation of the non-active transistor 17d.

In Embodiments 16 and 17, the non-active transistor is arranged in the empty region between the cell frame and the active transistor the nearest the cell frame. However, any of a dummy diffusion region, a dummy metal region, a substrate contact region, an intra-cell terminal region, and a contact may be arranged therebetween, as described in Embodiments 7 and 15. Also, several of them may be arranged therebetween in combination.

The standard cell subjected to the layout in either of Embodiments 16 and 17 is effective in a circuit that propagates a clock signal. The reason therefor has been described and is not described here.

In Embodiments 16 and 17, one of the cell ends is referred to, but the same layout form is applied desirably to the cell end on the opposite side. Because, standard cells are usually arranged left and right continuously at automatic placement and may have symmetric forms, and therefore, application of any of the above embodiments to only one of the cell ends cannot attain the aforementioned effects at the cell end where the embodiments are not applied. Another reason is that it is uncertain what kind of standard cell is arranged adjacent to a standard cell located at the end of the cell array.

Embodiment 18

Embodiment 18 provides a standard cell library including standard cells subjected to the layout in any of Embodiments 12 to 17. When design of a semiconductor integrated circuit is carried out with the use of the standard cell library, a semiconductor integrated circuit with less dispersion of a finished dimension of the gate length can be obtained.

Embodiment 19

In Embodiment 19, a semiconductor integrated circuit is designed with the use of a standard cell subjected to the layout in any of Embodiments 12 to 17. Hence, a semiconductor integrated circuit with less dispersion of a finished dimension of the gate length can be obtained.

Embodiment 20

Figure 21:
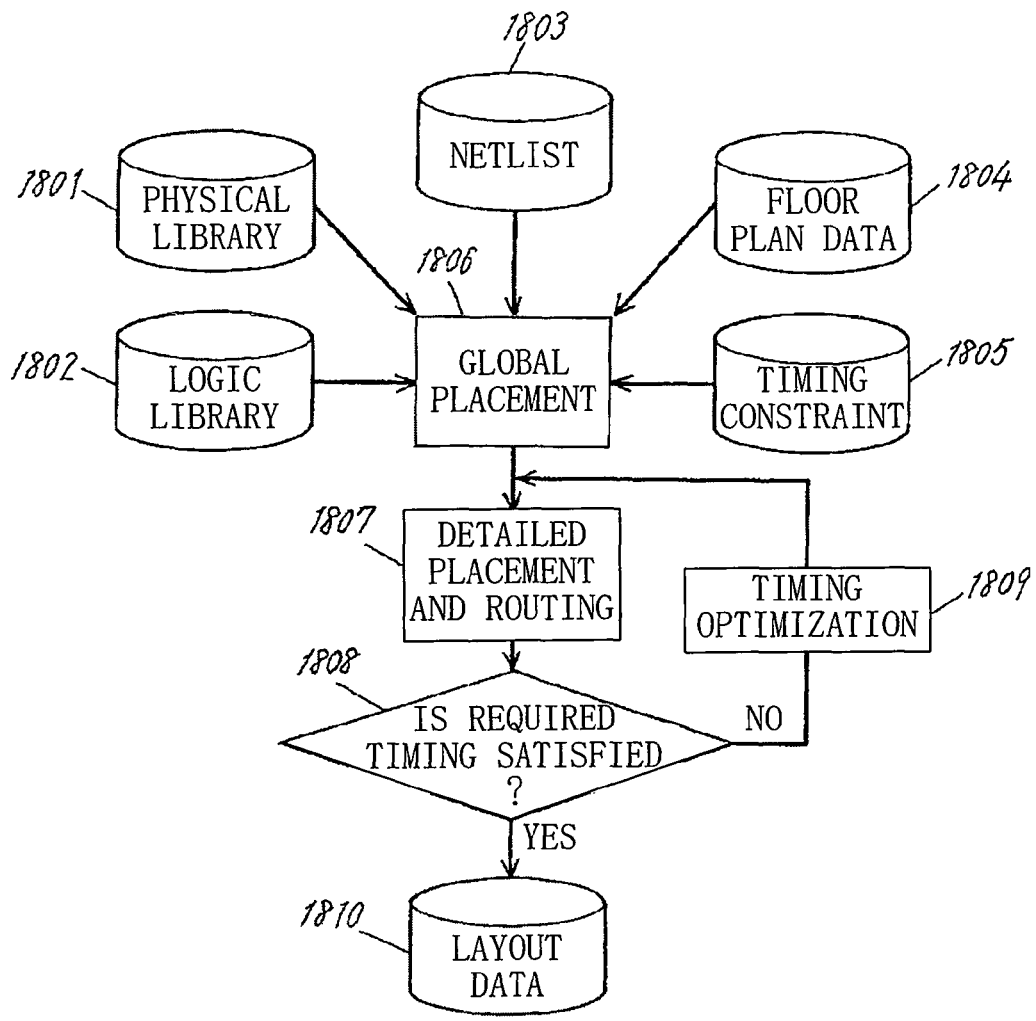
FIG. 21 is a flowchart showing a schematic deign flow using a automatic placement and routing tool for determining layout of a standard cell and a wring path among terminals.

FIG. 21 is a flowchart showing a schematic design flow using an automatic placement and routing tool that determines layout of standard cells and wiring paths among terminals. In the design flow in FIG. 18, there are input a physical library 1801, a logic library 1802, a netlist 1803 in which connection between standard cells described with the use of a standard cell library is described, a floor plan data 1804 indicating a region where an element can be arranged, and a timing constraint 1805 for defining operation timing of a circuit. The design flow includes a global placement step 1806, a detailed placement and routing step 1807, a timing judgment step 1808, and a timing optimization step 1809. The physical library 1801 has, in addition to physical shapes of signal terminals and the like of each standard cell, cell boundaries which control overlap between the respective standard cells. The logic library 1802 has attribute information for defining kinds of transistors in addition to description of operations of the standard cells.

In the global placement step 1806, respective standard cells composing the netlist 1803 are placed globally with timing information obtained from the timing constraint 1805 and the degree of closing up obtained from the floor plan data 1804 taken into consideration. Then in the detailed placement and routing step 1807, detailed placement and routing among the standard cells are performed to obtain layout data 1810 of a final semiconductor integrated circuit. After completion of the detailed placement and routing step 1807, whether or not required timing is satisfied is confirmed in the timing judgment step 1808. When not satisfied, the timing is improved by moving or replacing the cell and/or re-routing to repeat the detailed placement and routing step 1807 in the timing optimization step 1809.

Figure 22:
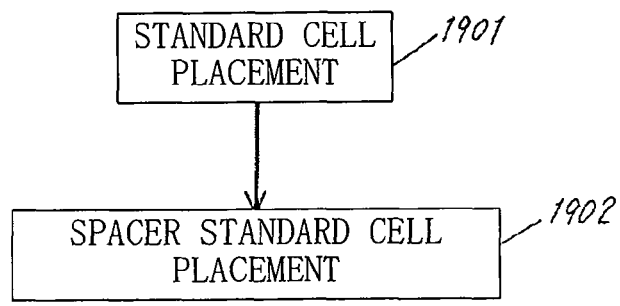
FIG. 22 is a flowchart of a semiconductor integrated circuit designing method according to Embodiment 20.

FIG. 22 is a flowchart of a semiconductor integrated circuit designing method according to Embodiment 20 of the present invention. Standard cells each including an active transistor are placed in a standard cell placement step 1901, and spacer standard cells are placed adjacent to the respective sides of a standard cell specified out of the standard cells in a spacer standard cell placement step 1902. Each spacer standard cell includes no active transistor and is provided specially for widening the space between cells.

Accordingly, when a standard cell including at a cell end thereof a transistor having a large gate length as a capacitance transistor is specified, spacer standard cells are arranged on the respective sides thereof. This reduces an increase in optical proximity effect that the transistor having the large gate length gives to neighboring gates and suppresses dispersion of gate length in a standard cell arranged on the opposite side of the standard cell including at the cell end thereof the transistor having the large gate length to the spacer standard cell.

It is noted that a standard cell that propagates a clock signal may be selected as the specified standard cell. When a spacer standard cell is arranged adjacent to the standard cell that propagates a clock signal, the influence by the optical proximity effect can be reduced which the standard cell that propagates a clock signal would receive from a transistor included in the adjacent standard cell, suppressing dispersion of gate length in the standard cell that propagates a clock signal. Particularly, the effect of suppressing the influence by the optical proximity effect from a standard cell having a large gate length and arranged adjacent to the standard cell that propagates a clock signal is significant.

Referring to standard cells arranged on the respective ends of a cell array, a standard cell is arranged on one side while no standard cell is arranged on the other side. Accordingly, when the standard cells located on the respective ends of the cell array are selected as the specified standard cells, the influence by the optical proximity effect on the standard cells arranged on the respective ends of the cell array can be reduced.

Desirably, the steps indicated in FIG. 22 are included in the global placement step 1806 or the detailed placement and routing step 1807 in FIG. 21.

Semiconductor integrated circuit designing equipment that performs the processing in FIG. 21 and FIG. 22 will be described next. The designing equipment includes a storage section such as a hard disk drive, a processing section such as a CPU, a keyboard, and a monitor. For example, the steps indicated in FIG. 22 are included in the global placement step 1806 in FIG. 21.

The storage section is allowed to store the physical library 1801, the logic library 1802, the netlist 1803, the floor plan data 1804, the timing constraint 1805, and the layout data 1810, and input/output of data is performed there. The processing section performs arithmetic operation for the global placement step 1806, the detailed placement and routing step 1807, the timing judgment step 1808, the timing optimization step 1809, the standard cell placement step 1901, and the spacer standard cell placement step 1902. The user specifies a standard cell to be arranged adjacent to a spacer standard cell through the keyboard or the like and confirms data at the intermediate stage of the design through a screen of the monitor and confirms the layout data 1810. In this way, it is needless to say that the present invention can be realized on hardware.

Figure 23:
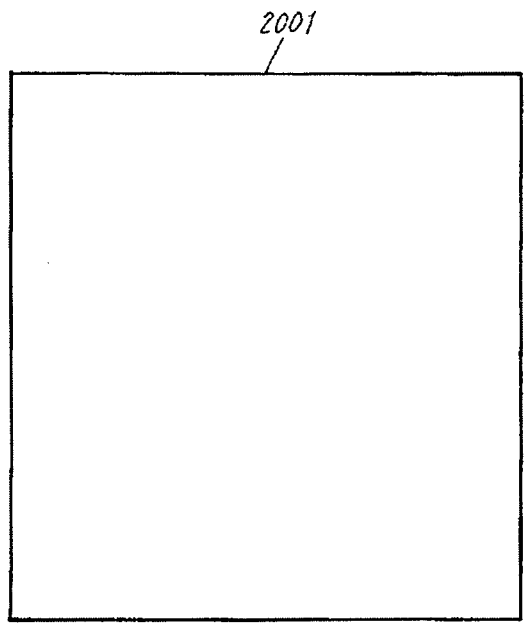
FIG. 23 is a layout diagram schematically expressing a spacer standard cell.

FIG. 23 is a layout diagram schematically expressing a spacer standard cell. The spacer standard cell is provided principally for the purpose of widening the space between standard cells so as to reduce the influence of the optical proximity effect. Accordingly, though there is no special need to arrange any element in the spacer standard cell, the empty region of the spacer standard cell may be utilized as long as no adverse influence by the optical proximity effect is involved.

Figure 24:
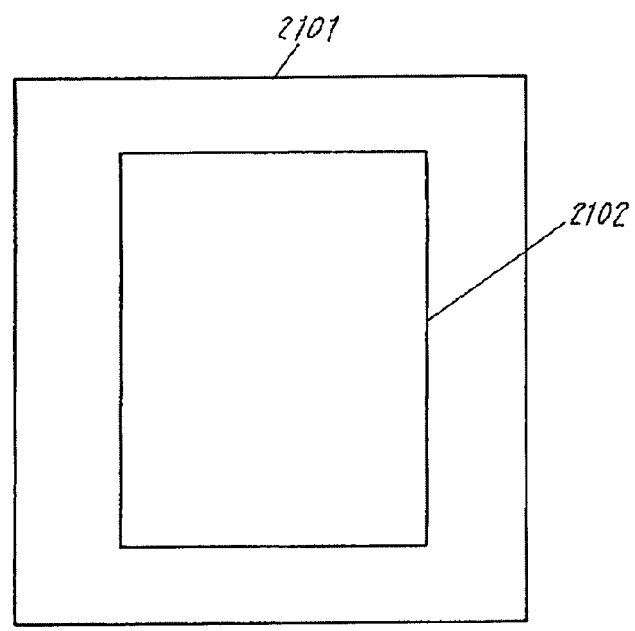
FIG. 24 is a layout diagram showing a spacer standard cell which includes a dummy diffusion region.

FIG. 24 is a layout diagram showing a spacer standard cell including a dummy diffusion region. With the arrangement shown in FIG. 24, an effect of making the pattern density of diffusion regions to be averaged can be obtained besides the effect of suppressing dispersion of gate length, which is inherently expected from the provision of the spacer standard cell. In the spacer standard cell, any of a non-active transistor, a dummy gate, a diode, a dummy metal wring may be arranged as well. The reason and the obtainable effects have been described already and are not described here.

The present invention suppresses variation in circuit characteristic by suppressing dispersion of gate length, and therefore, is useful in semiconductor integrated circuits or the like employed in various electronic appliances.

What is claimed is:

1. A semiconductor integrated circuit, comprising:
    a first transistor including a first gate extending in a first direction and a first diffusion region and which is configured to be active;
    a second transistor including a second gate extending in the first direction and a second diffusion region and which is arranged adjacent to the first transistor in a second direction intersected at a right angle with the first direction; and
    a third transistor including a third gate extending in the first direction and the first diffusion region and which is arranged adjacent in the second direction to the first transistor on an opposite side to the second transistor,
    wherein a space between the first gate and the second gate is larger than a space between the first gate and the third gate, and
    the first gate, the second gate and the third gate are included in at least one of a plurality of standard cells.

2. The semiconductor integrated circuit of claim 1, wherein the first gate, the second gate and the third gate are included in a first standard cell of said plurality of standard cells.

3. The semiconductor integrated circuit of claim 1, wherein at least two of the first gate, the second gate and the third gate are included in a first standard cell of said plurality of standard cells, and the other one of the first gate, the second gate and the third gate is included in a second standard cell of said plurality of standard cells.

4. The semiconductor integrated circuit of claim 1, wherein there is a non-active transistor disposed between the first transistor and the second transistor in the second direction.

5. The semiconductor integrated circuit of claim 1, wherein the space between the first gate and the second gate is two times or more the space between the first gate and the third gate.

6. The semiconductor integrated circuit of claim 1, wherein the space between the first gate and the second gate is three times or more the space between the first gate and the third gate.

7. The semiconductor integrated circuit of claim 1, further including:
    at least one dummy gate extending in the first direction between the first gate and the second gate.

8. The semiconductor integrated circuit of claim 7, wherein the first gate, the second gate, the third gate, and the dummy gate are arranged at regular intervals in the second direction.

9. The semiconductor integrated circuit of claim 8, wherein the first gate, the second gate, the third gate, and the dummy gate are equal to one another in gate length.

10. The semiconductor integrated circuit of claim 1, further including:
    a non-active fourth transistor including a fourth gate extending in the first direction between the first gate and the second gate.

11. The semiconductor integrated circuit of claim 10, wherein the fourth transistor is an off transistor.

12. The semiconductor integrated circuit of claim 10, wherein the fourth transistor forms a capacitor.

13. The semiconductor integrated circuit of claim 10, further including:
    at least one dummy gate extending in the first direction between the first gate and the second gate.

14. The semiconductor integrated circuit of claim 13, wherein the first gate, the second gate, the third gate, the fourth gate, and the dummy gate are arranged at regular intervals in the second direction.

15. The semiconductor integrated circuit of claim 14, wherein the first gate, the second gate, the third gate, the fourth gate, and the dummy gate are equal to one another in gate length.

16. The semiconductor integrated circuit of claim 1, further including:
    a dummy diffusion region between the first gate and the second gate.

17. The semiconductor integrated circuit of claim 1, further including:
    a substrate contact between the first gate and the second gate.

18. The semiconductor integrated circuit of claim 1, further including:
    a dummy metal wiring between the first gate and the second gate.

19. The semiconductor integrated circuit of claim 1, wherein a gate length of the second gate is larger than a gate length of the first gate.

20. The semiconductor integrated circuit of claim 19, wherein the second transistor forms a capacitor.

21. The semiconductor integrated circuit of claim 1, wherein the first transistor is used in a circuit that propagates a clock signal.

22. The semiconductor integrated circuit of claim 21, wherein the circuit that propagates a clock signal is an inverter circuit or a buffer circuit.

23. The semiconductor integrated circuit of claim 1, further including:
    a fourth transistor including the first gate extending in the first direction and a third diffusion region separated from the first diffusion region,
    wherein the third diffusion region is arranged adjacent in the first direction to the first diffusion region.

24. The semiconductor integrated circuit of claim 23, further including:
    a fifth transistor including the third gate extending in the first direction and the third diffusion region.

25. The semiconductor integrated circuit of claim 24, further including:
    a sixth transistor including the second gate extending in the first direction and a fourth diffusion region separated from the second diffusion region,
    wherein the fourth diffusion region is arranged adjacent in the first direction to the second diffusion region on a same side to the third diffusion region.

26. The semiconductor integrated circuit of claim 25, wherein the first gate, the second gate and third gate are substantially straight lines.

27. The semiconductor integrated circuit of claim 23, wherein the first diffusion region and the second diffusion region are p+ diffusion region, and
    the third diffusion region and fourth diffusion region are n+ diffusion region.

28. The semiconductor integrated circuit of claim 23, further including:
    at least one dummy gate extending in the first direction between the first gate and the second gate.

29. The semiconductor integrated circuit of claim 28, wherein the first gate, the second gate, the third gate, and the dummy gate are arranged at regular intervals in the second direction.

30. The semiconductor integrated circuit of claim 29, wherein the first gate, the second gate, the third gate, and the dummy gate are equal to one another in gate length.

31. The semiconductor integrated circuit of claim 23, further including,
at least one substrate contact between the first gate and second gate.

32. A semiconductor integrated circuit, comprising:
a first transistor including a first gate extending in a first direction and a first diffusion region and which is capable of being active;
a second transistor including a second gate extending in the first direction and a second diffusion region and which is arranged adjacent to the first transistor in a second direction intersected at a right angle with the first direction; and
a third transistor including a third gate extending in the first direction and a third diffusion region separated from the first diffusion region and which is arranged adjacent in the second direction to the first transistor on an opposite side to the second transistor,
wherein a space between the first gate and the second gate is larger than a space between the first gate and the third gate, and
the first gate, the second gate and the third gate are included in at least one of a plurality of standard cells.

33. The semiconductor integrated circuit of claim 32, wherein the first gate, the second gate and the third gate are included in a first standard cell of said plurality of standard cells.

34. The semiconductor integrated circuit of claim 32, wherein at least two of the first gate, the second gate and the third gate are included in a first standard cell of said plurality of standard cells, and the other one of the first gate, the second gate and the third gate is included in a second standard cell of said plurality of standard cells.

35. The semiconductor integrated circuit of claim 32, wherein there is a non-active transistor disposed between the first transistor and the second transistor in the second direction.

36. The semiconductor integrated circuit of claim 32, wherein the space between the first gate and the second gate is two times or more the space between the first gate and the third gate.

37. The semiconductor integrated circuit of claim 32, wherein the space between the first gate and the second gate is three times or more the space between the first gate and the third gate.

38. The semiconductor integrated circuit of claim 32, further including:
at least one dummy gate extending in the first direction between the first gate and the second gate.

39. The semiconductor integrated circuit of claim 38, wherein the first gate, the second gate, the third gate, and the dummy gate are arranged at regular intervals in the second direction.

40. The semiconductor integrated circuit of claim 39, wherein the first gate, the second gate, the third gate, and the dummy gate are equal to one another in gate length.

41. The semiconductor integrated circuit of claim 32, further including:
a non-active fourth transistor including a fourth gate extending in the first direction between the first gate and the second gate.

42. The semiconductor integrated circuit of claim 41, wherein the fourth transistor is an off transistor.

43. The semiconductor integrated circuit of claim 41, wherein the fourth transistor forms a capacitor.

44. The semiconductor integrated circuit of claim 41, further including:
at least one dummy gate extending in the first direction between the first gate and the second gate.

45. The semiconductor integrated circuit of claim 44, wherein the first gate, the second gate, the third gate, the fourth gate, and the dummy gate are arranged at regular intervals in the second direction.

46. The semiconductor integrated circuit of claim 45, wherein the first gate, the second gate, the third gate, the fourth gate, and the dummy gate are equal to one another in gate length.

47. The semiconductor integrated circuit of claim 32, further including:
a dummy diffusion region between the first gate and the second gate.

48. The semiconductor integrated circuit of claim 32, further including:
a substrate contact between the first gate and the second gate.

49. The semiconductor integrated circuit of claim 32, further including:
a dummy metal wiring between the first gate and the second gate.

50. The semiconductor integrated circuit of claim 32, wherein a gate length of the second gate is larger than a gate length of the first gate.

51. The semiconductor integrated circuit of claim 50, wherein the second transistor forms a capacitor.

52. The semiconductor integrated circuit of claim 32, wherein the first transistor is used in a circuit that propagates a clock signal.

53. The semiconductor integrated circuit of claim 51, wherein the circuit that propagates a clock signal is an inverter circuit or a buffer circuit.

54. The semiconductor integrated circuit of claim 32, further including:
a fourth transistor including the first gate extending in the first direction and a third diffusion region separated from the first diffusion region,
wherein the third diffusion region is arranged adjacent in the first direction to the first diffusion region.

55. The semiconductor integrated circuit of claim 54, further including:
a fifth transistor including the third gate extending in the first direction and the third diffusion region.

56. The semiconductor integrated circuit of claim 55, further including:
a sixth transistor including the second gate extending in the first direction and a fourth diffusion region separated from the second diffusion region,
wherein the fourth diffusion region is arranged adjacent in the first direction to the second diffusion region on a same side to the third diffusion region.

57. The semiconductor integrated circuit of claim 56, wherein the first gate, the second gate and third gate are substantially straight lines.

58. The semiconductor integrated circuit of claim 54, wherein the first diffusion region and the second diffusion region are p+ diffusion region, and the third diffusion region and fourth diffusion region are n+ diffusion region.

59. The semiconductor integrated circuit of claim 54, further including:
at least one dummy gate extending in the first direction between the first gate and the second gate.

60. The semiconductor integrated circuit of claim 59, wherein the first gate, the second gate, the third gate, and the dummy gate are arranged at regular intervals in the second direction.

61. The semiconductor integrated circuit of claim 60, wherein the first gate, the second gate, the third gate, and the dummy gate are equal to one another in gate length.

62. The semiconductor integrated circuit of claim 54, further including:
at least one substrate contact between the first gate and second gate.

* * * * *